United States Patent
Mimata et al.

(10) Patent No.: US 6,383,844 B2
(45) Date of Patent: May 7, 2002

(54) MULTI-CHIP BONDING METHOD AND APPARATUS

(75) Inventors: Tsutomu Mimata, Akiruno; Osamu Kakutani, Oume, both of (JP)

(73) Assignee: Kabushiki Kaisha Shinkawa, Tokyo (JP)

(*) Notice: Subject to any disclaimer, the term of this patent is extended or adjusted under 35 U.S.C. 154(b) by 0 days.

(21) Appl. No.: 09/748,812

(22) Filed: Dec. 26, 2000

(30) Foreign Application Priority Data

Dec. 24, 1999 (JP) .......................................... 11-366163

(51) Int. Cl.[7] .......................... H01L 21/44; H01L 21/48; H01L 21/50
(52) U.S. Cl. ....................................... 438/118; 438/907
(58) Field of Search .................................. 438/118, 907

(56) References Cited

U.S. PATENT DOCUMENTS 5,273,622 A * 12/1993 Jacobsen
5,759,873 A * 6/1998 Kata et al.
6,232,136 B1 * 5/2001 Zavracky et al.
6,297,075 B1 * 10/2001 Odajima et al.
6,312,974 B1 * 11/2001 Wu et al.

* cited by examiner

Primary Examiner—John F. Niebling
Assistant Examiner—Josetta I. Jones
(74) Attorney, Agent, or Firm—Koda & Androlia

(57) ABSTRACT

A multi-chip bonding method and apparatus, in which a first wafer ring which has electronic components of a first type is held by a holding device; substrates are fed out to a conveying device from the first storing section; the electronic components of the first type on the holding device are successively bonded to the substrates; the substrates with the electronic components of the first type bonded is accommodated in the second storing section; the first wafer ring held by the holding device is exchanged for a second wafer ring which has electronic components of a second type; the substrates accommodated in the second storing section is fed out to the conveying device; the electronic components of the second type are successively bonded to the substrates; and the substrates with the electronic components of the second type bonded is accommodated in the first storing section.

3 Claims, 3 Drawing Sheets

MULTI-CHIP BONDING METHOD AND APPARATUS

BACKGROUND OF THE INVENTION

1. Field of the Invention

The present invention relates to a multi-chip bonding method and apparatus used in the manufacturing process of hybrid semiconductor devices.

2. Prior Art

In hybrid semiconductor devices, as shown in FIG. 2, semiconductor chips 2A and 2B of different types, e.g., two types, are mounted on a substrate 1. Prior art multi-chip bonding methods and apparatus for such mounting of semiconductor chips 2A and 2B of different types on a substrate 1 will be described below.

As shown in FIG. 3, the first method is a method in which wafer rings 4 (4A, 4B . . . ) or trays are exchanged for each individual substrate 1. The case of wafer rings will be described below.

As shown in FIG. 3, a wafer 3 pasted to the surface of a wafer sheet (not shown) is split longitudinally and laterally into a lattice form, and the wafer sheet is stretched so that individual semiconductor chips 2 (2A, 2B . . . ) are formed. The outer circumferential portion of the wafer sheet is attached to a wafer ring 4 (4A, 4B . . . ). The wafer rings 4 (4A, 4B . . . ) are accommodated in a wafer ring cassette 5 in which the rings are stacked in a vertical configuration with a fixed spacing maintained between the individual wafer rings, and this wafer ring cassette 5 is positioned and held in an elevator device (not shown). Here, wafer rings 4A, 4B . . . which have different types of semiconductor chips 2A, 2B . . . are accommodated in the wafer ring cassette 5. In other words, a wafer ring 4A which has semiconductor chips 2A, a wafer ring 4B which has semiconductor chips 2B, and so on, are accommodated.

A holding device 6 for holding wafer rings, trays, etc. (merely called "holding device 6") is installed at a fixed distance from the wafer ring cassette 5 on the side of the accommodation opening of the wafer ring cassette 5. A push-up needle (not shown) which pushes the semiconductor chips 2 (2A, 2B . . . ) upward is installed beneath the pick-up position 7 of this holding device 6. The wafer rings 4 (4A, 4B . . . ) inside the wafer ring cassette 5 are chucked by a wafer ring conveying means (not shown) and are thus conveyed to the holding device 6, where the wafer rings are positioned and held. Furthermore, the wafer rings 4 (4A, 4B . . . ) that are held by the holding device 6 are chucked by wafer ring conveying means and accommodated in their original positions in the wafer ring cassette 5.

The above-described wafer ring cassette 5, elevator device (not shown) that positions and holds the wafer ring cassette 5, holding device 6, and wafer ring conveying means (not shown) are described in, for example, Japanese Patent Application Laid-Open (Kokai) Nos. H9-64147 and H9-64148. In Japanese Patent Application Laid-Open (Kokai) No. H9-64147, guide rails (wafer ring holder) for guiding wafer rings are vertically movable and horizontally rotatable near the wafer ring cassette, and the guide rails are set to be horizontal at the same height when the wafer is carried. In Japanese Patent Application Laid-Open (Kokai) No. H9-64148, a sensor for detecting wafer rings is provided on either the upper or lower claw provided in the wafer ring conveying means.

Meanwhile, the substrates 1 are accommodated in the substrate cassette 11 of a loader section 10. Each substrate 1 that is fed out from the substrate cassette 11 is conveyed by a substrate conveying device 12. An adhesive material is dropped onto the bonding portions of this substrate 1 by an adhesive material dropping device 20; then semiconductor chips (2A, 2B . . . ) are bonded to the bonding portions by a bonding apparatus 30, after which the substrate 1 is accommodate in the substrate cassette 14 of an unloader section 13.

The adhesive material dropping device 20 has a pre-forming nozzle 21 which accommodates the adhesive material; this pre-forming nozzle 21 is installed so that it is moved upward and downward on the Y table 23 of a universally known XY table 24 that consists of an X table 22 and Y table 23. The bonding apparatus 30 has a bonding tool 31 that holds the semiconductor chips 2 (2A, 2B . . . ) by vacuum suction and bonds the chips to the substrate 1. This bonding tool 31 is installed so that it is moved upward and downward on the Y table 33 of a universally known XY table 34 that consists of an X table 32 and Y table 33.

Next, the operation of the above apparatus will be described. In order to simplify the description, a case in which two types of semiconductor chips 2A and 2B are bonded to each substrate 1 as shown in FIG. 2 will be described.

The wafer ring 4A inside the wafer ring cassette 5 is conveyed by the wafer ring conveying means (not shown) and is positioned and held by the holding device 6. Then, the semiconductor chip 2A that is to be picked up is moved to the pick-up position 7.

Meanwhile, a substrate 1 inside the substrate cassette 1 1 of the loader section 10 is fed out onto the substrate conveying device 12. When this substrate 1 is conveyed to the adhesive material dropping station of the adhesive material dropping device 20 by the substrate conveying device 12 and positioned in this station, an adhesive material is dropped onto the bonding portions (located in six places in the case of FIG. 2) of the substrate 1 by the movement of the XY table 24 of the adhesive material dropping device 20 in the directions of the X and Y axes and the upward and downward movement of the preforming nozzle 21.

Next, when the substrate 1 onto which the adhesive material has been dropped is conveyed to the bonding station of the bonding apparatus 30 by the substrate conveying device 12 and is positioned in this bonding station, the bonding tool 31 of the bonding apparatus 30 vacuum-chucks a semiconductor chip 2A on the wafer ring 4A and is moved to point above the substrate 1, after which the bonding tool 31 bonds this semiconductor chip 2A to a bonding portion of the substrate 1 to which such a semiconductor chip 2A is to be bonded, in accordance with a method which will be described below.

The vacuum-chucking of the semiconductor chip 2A on the wafer ring 4A by the bonding tool 31, and the transfer and bonding of this chip to the substrate 1, are performed as follows: the bonding tool 31 is moved to a point above the pick-up position 7 by the XY table 34 and is then lowered, and the push-up needle (not shown) disposed beneath the pick-up position 7 is raised. As a result, the semiconductor chip 2A is pushed upward, and the bonding tool 31 chucks the semiconductor chip 2A by vacuum suction. The bonding tool 31 is then raised and is moved by the XY table 34 to a point above the bonding portion of the substrate 1 to which the semiconductor chip 2A is to be bonded. Next, the bonding tool 31 is lowered, and bonds the semiconductor chip 2A to the bonding portion of the substrate 1. Following this bonding, the vacuum of the bonding tool 31 is cut off, and the bonding tool 31 is raised. When the semiconductor chip 2A is picked up from the wafer ring 4A as described above, the next semiconductor chip 2A that is to be picked up is moved to the pick-up position 7.

Since four semiconductor chips 2A are bonded to each substrate 1 shown in FIG. 2, the operation in which the bonding tool 31 vacuum-chucks a semiconductor chip 2A from the wafer ring 4A and bonds this semiconductor chip 2A to a bonding portion of the substrate 1 is performed four times for each substrate 1.

When the bonding of the semiconductor chips 2A to the substrate 1 has been completed, the wafer ring 4A held by the holding device 6 is conveyed by the wafer ring conveying device (not shown) and accommodated in its original position in the wafer ring cassette 5. Next, the wafer ring cassette 5 is moved upward or downward by the elevator device (not shown), so that the wafer ring 4B is moved to the conveying level, and the wafer ring 4B inside the wafer ring cassette 5 is conveyed by the wafer ring conveying device and positioned and held by the holding device 6.

Then, by the method described above, the bonding tool 31 vacuum-chucks semiconductor chips 2B from the wafer ring 4B, and these semiconductor chips 2B are bonded to the bonding portions of the substrate 1 to which such semiconductor chips 2B are to be bonded. Since two semiconductor chips 2B are bonded to each substrate 1 shown in FIG. 2, the bonding of the semiconductor chips 2B is performed twice for each substrate 1.

When the bonding of the semiconductor chips 2A and 2B to a single substrate 1 has thus been completed, this substrate 1 is conveyed by the substrate conveying device 12 and accommodated inside the substrate cassette 14 of the unloader section 13. As a result of the above-described series of processes, the substrates 1 inside the substrate cassette 11 of the loader section 10 are successively conveyed by the substrate conveying device 12, the adhesive material is dropped onto the bonding portions by the adhesive material dropping device 20, and the semiconductor chips 2A and 2B are bonded to the bonding portions by the bonding apparatus 30. In this case, the wafer ring 4A is held by the holding device 6 as described above in order to bond the semiconductor chips 2A; then, when the semiconductor chips 2B are to be bonded, the wafer ring 4A is replaced by the wafer ring 4B, and this wafer ring 4B is held by the holding device 6.

As shown in FIG. 4, the second method is a method in which a plurality of wafer rings 4A through 4D or trays of different types are held by a holding device 40 for wafer rings, etc., and the desired wafer rings 4A through 4D or trays are selectively moved to the pick-up position 7. Here as well, the case of wafer rings 4A through 4D will be described.

As shown in FIG. 4, the holding device 40 for wafer rings, etc. is driven in the directions of the X and Y axes and supported so that it is free to rotate about a central shaft 41. Then, the holding device 40 is caused to rotate by a rotational driving means (not shown). Furthermore, in the example shown in FIG. 4, four wafer rings 4A through 4D of different types are positioned and held by the holding device 40 for wafer rings, etc. The remaining constructions, i.e., the loader section 10, substrate cassette 11, substrate conveying device 12, unloader section 13, substrate cassette 14, adhesive material dropping device 20 and bonding apparatus 30, are the same as in FIG. 3. Furthermore, a push-up needle (not shown) which pushes the semiconductor chips 2A through 2D upward is installed beneath the pick-up position 7 of the holding device 40 for wafer rings, etc.

Next, the operation of the above-described apparatus will be described. In the case of this method as well, a case in which two types of semiconductor chips 2A and 2B are bonded to each substrate 1 as shown in FIG. 2 will be described in order to simplify the description.

The method shown in FIG. 4 differs from the method shown in FIG. 3 only in the following respects:

In the method shown in FIG. 3, after all of the semiconductor chips 2A from the wafer ring 4A held by the holding device 6 have been bonded to the bonding portions for these semiconductor chips 2A on a single substrate 1, the wafer ring 4A held by the holding device 6 is replaced by the wafer ring 4B, and all of the semiconductor chips 2B are bonded to the bonding portions for these semiconductor chips 2B on the substrate 1. Then, the substrate 1 to which all of these semiconductor chips 2A and 2B have been bonded is accommodated in the substrate cassette 14 of the unloader section 13.

In the method shown in FIG. 4, the semiconductor chips 2A that are to be picked up from the wafer ring 4A are moved to the pick-up position 7 by rotating the holding device 40 for wafer rings, etc. Then, as in the case of FIG. 3, after all of the semiconductor chips 2A from the wafer ring 4A have been bonded to the bonding portions for these semiconductor chips 2A on a single substrate 1, the holding device 40 for wafer rings, etc. is rotated so that the semiconductor chips 2B that are to be picked up from the wafer ring 4B are moved to the pick-up position 7, and all of the semiconductor chips 2B from the wafer ring 4B are bonded to the bonding portions for these semiconductor chips 2B on the substrate 1 in the same manner as in FIG. 3. Afterward, the substrate 1 to which all of these semiconductor chips 2A and 2B have been bonded is accommodated in the substrate cassette 14 of the unloader section 13.

In the first method shown in FIG. 3, after all of the semiconductor chips 2A from the wafer ring 4A held by the holding device 6 have been bonded to the bonding portions (to which these semiconductor chips 2A are to be bonded) on a single substrate 1, the wafer ring 4A held by the holding device 6 is replaced by the wafer ring 4B, and all of the semiconductor chips 2B from the wafer ring 4B held by the holding device 6 are bonded to the bonding portions (to which these semiconductor chips 2B are to be bonded) on the substrate 1. More specifically, since it is necessary to exchange the wafer ring 4 (4A, 4B . . . ) for each substrate 1, the frequency with which the wafer ring 4 (4A, 4B . . . is exchanged is great, so that the productivity is poor.

In the second method shown in FIG. 4, a plurality of wafer rings 4A through 4D are held by the holding device 40 for wafer rings, etc., and the selection of the desired wafer ring 4A through 4D is accomplished merely by rotating the holding device 40 for wafer rings, etc.; accordingly, this method is superior in terms of productivity. However, the size of the holding device 40 for wafer rings, etc., is increased, and the apparatus is complicated. In the example shown in FIG. 4, four wafer rings 4A through 4D are held; however, in cases where five or more wafer rings are held, the size of the device is increased even further.

BRIEF SUMMARY OF THE INVENTION

The object of the present invention is to provide a multi-chip bonding method and apparatus that causes no increase in the size of the holding device for wafer rings, etc., and improves the productivity.

The above objects are accomplished by a unique method and apparatus of the present invention, wherein a substrate conveying device that conveys substrates, first and second substrate supplying and accommodating sections that are respectively disposed at both ends of the substrate conveying device, a bonding apparatus that bonds electronic components to the substrates conveyed by the substrate conveying device, and a holding device which holds a wafer ring or tray that has electronic components, are provided; and (i) a first wafer ring or tray which has electronic components of a first type that are to be bonded to the substrates is held by the holding device, (ii) substrates are successively fed out to the substrate conveying device from the first substrate supplying and accommodating section, (iii) the electronic components of the first type on the holding device are successively bonded to all of the bonding portions of the substrates to which electronic components of the first type are to be bonded, (iv) the substrates on which the bonding of the electronic components of the first type has been completed are successively accommodated in the second substrate supplying and accommodating section, (v) the first wafer ring or tray held by the holding device is exchanged by a wafer ring conveying device for a second wafer ring or tray which has electronic components of a second type that are to be bonded to the substrates, thus holding the second wafer ring or tray by the holding device, (vi) the substrates accommodated in the second substrate supplying and accommodating section are successively fed out to the substrate conveying device, (vii) the electronic components of the second type on the holding device are successively bonded to all of the bonding portions on the substrates to which electronic components of the second type are to be bonded, and (viii) the substrates on which the bonding of the electronic components of the second type has been completed are successively accommodated in the first substrate supplying and accommodating section.

In the above, a dropping of an adhesive material on the bonding portions to which the electronic components of the first type are to be bonded on the substrates fed out of the first substrate supplying and accommodating section, and a dropping of an adhesive material on the bonding portions to which the electronic components of the second type are to be bonded on the substrates fed out of the second substrate supplying and accommodating section, are performed by a single adhesive material dropping device.

Alternately, the dropping of the adhesive material on the bonding portions to which the electronic components of the first type are to be bonded on the substrates fed out of the first substrate supplying and accommodating section, and the dropping of an adhesive material on the bonding portions to which the electronic components of the second type are to be bonded on the substrates fed out of the second substrate supplying and accommodating section, can be performed by respectively separate adhesive material dropping devices.

DETAILED DESCRIPTION OF THE INVENTION

Figure 1A:
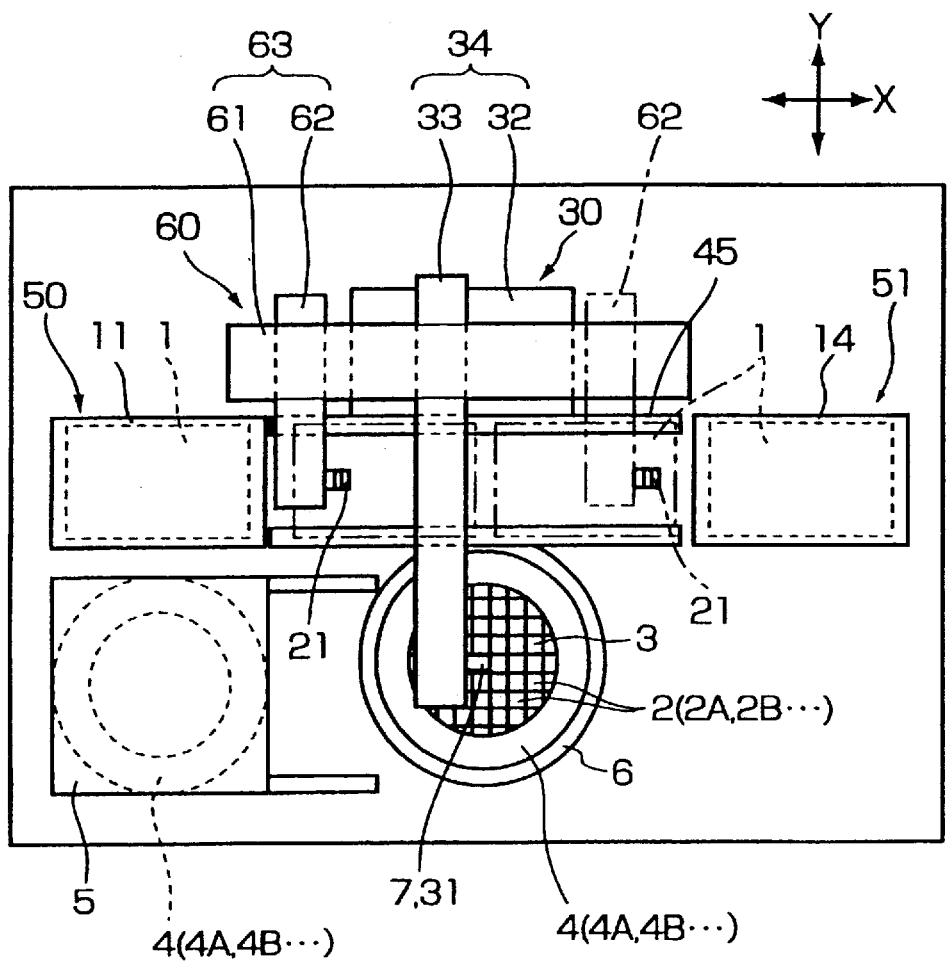
FIG. 1A is a top view of one embodiment of the multi-chip bonding method according to the present invention.
Figure 1B:
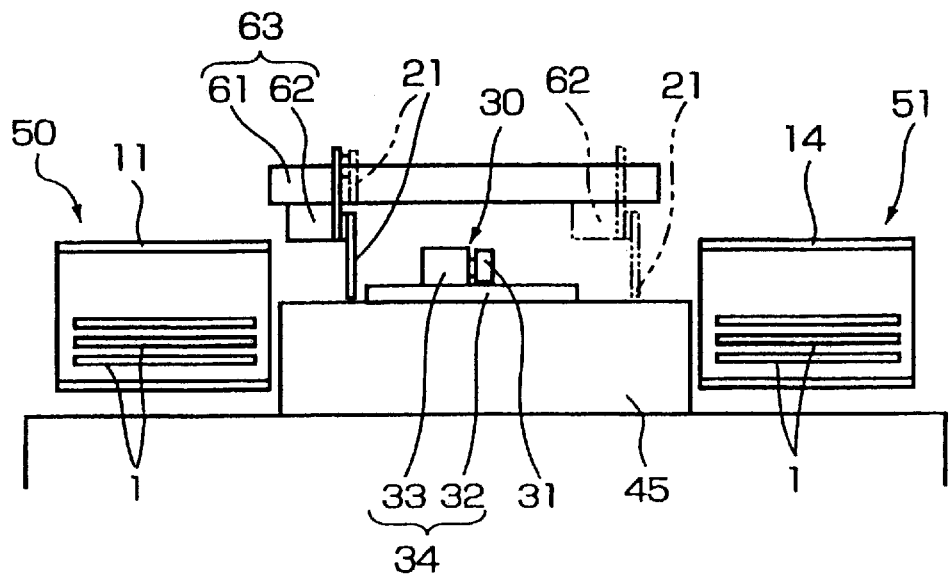
FIG. 1B is a partially sectional front view.

One embodiment of the present invention will be described with reference to FIG. 1. The present embodiment relates to an improvement of the method shown in FIG. 3. Accordingly, this embodiment will be described with the same symbols assigned to members that are the same as in FIG. 3. The present embodiment differs in the following respects from the construction and method shown in FIG. 3.

Figure 3:
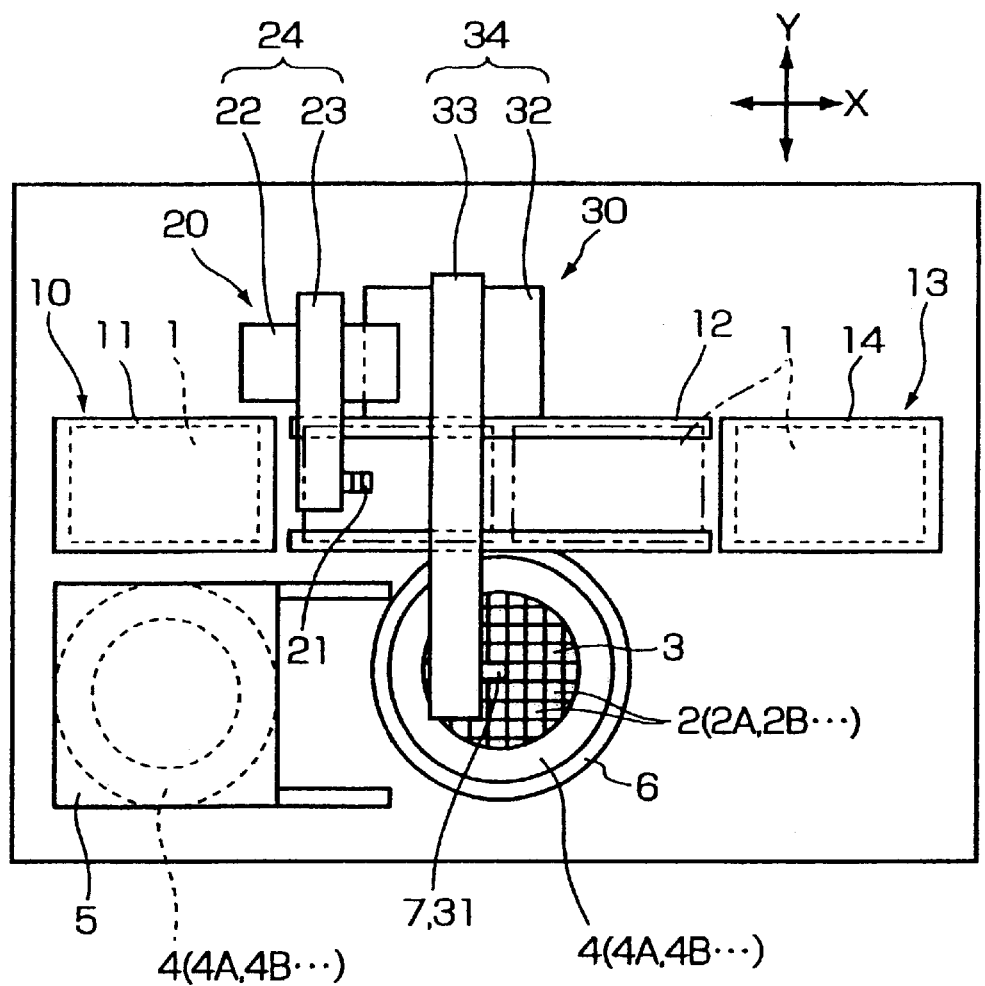
FIG. 3 is a top of one example of a conventional multi-chip bonding method.
Figure 4:
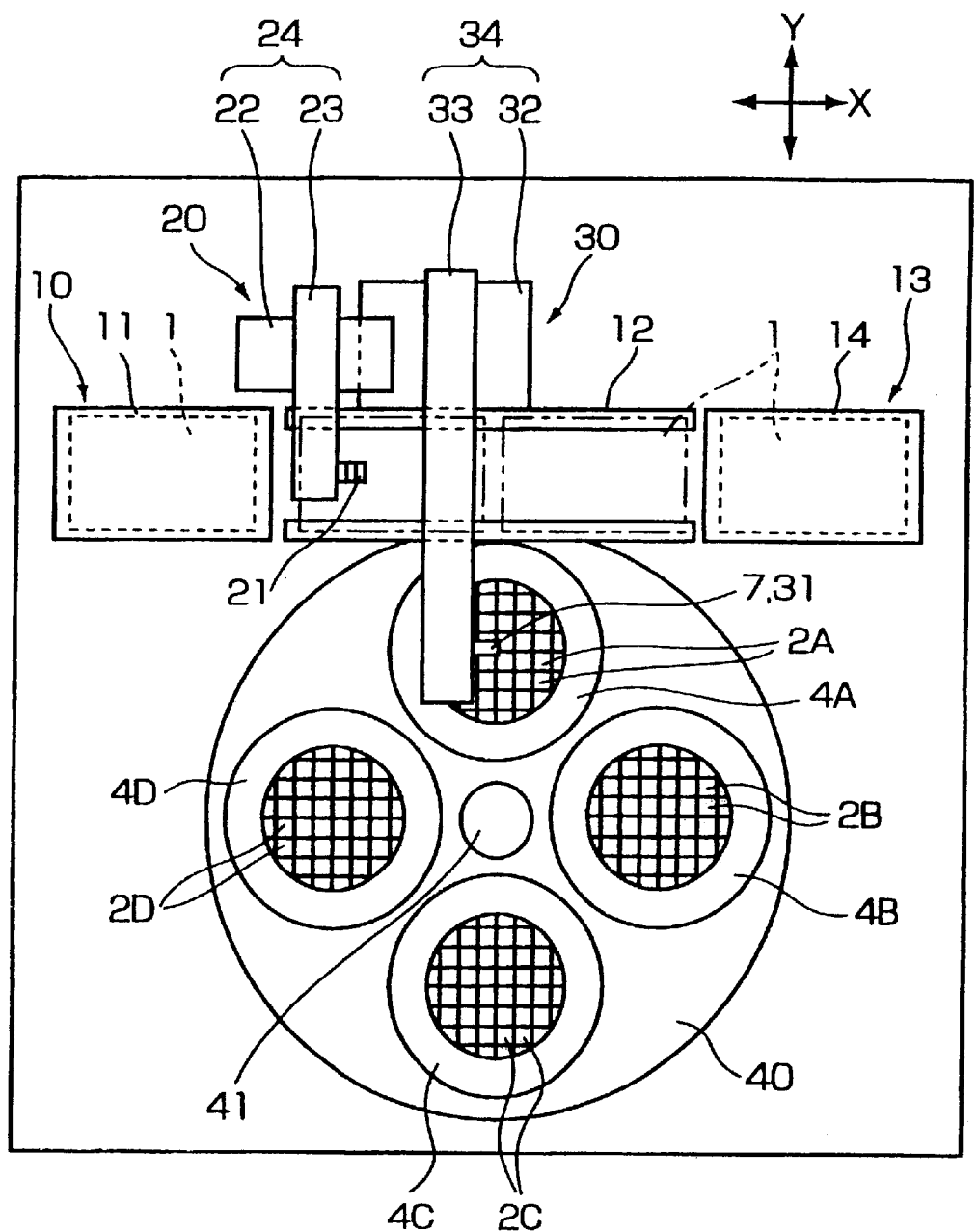
FIG. 4 is a top view of another example of a conventional multi-chip bonding method.

First, the respects in which the construction differs will be described. In the present embodiment, the loader section 10 and unloader section 13 shown in FIG. 3 are respectively first and second substrate supplying and accommodating sections 50 and 51. Furthermore, the substrate conveying device 12 in FIG. 3 is arranged so that it conveys substrates 1 only from the loader section 10 to the unloader section 13. However, the substrate conveying device 45 of this embodiment is arranged so that it can convey substrates 1 fed out from the substrate cassette 11 of the first substrate supplying and accommodating section 50 to the substrate cassette 14 of the second substrate supplying and accommodating section 51, accommodate these substrates 1 in the substrate cassette 14, and can convey substrates 1 fed out from the substrate cassette 14 of the second substrate supplying and accommodating section 51 to the substrate cassette 11 of the first substrate supplying and accommodating section 50 and accommodate these substrates 1 in the substrate cassette 11.

Furthermore, the pre-forming nozzle 21 of the adhesive material dropping device 20 shown in FIG. 3 is installed so that it is moved only between the Y table 33 of the bonding apparatus 30 and the loader section 10. The pre-forming nozzle 21 of the adhesive material dropping device 60 of the present embodiment is constructed so that it is moved not only between the Y table 33 of the bonding apparatus 30 and the first substrate supplying and accommodating section 50, but also between the Y table 33 and the second substrate supplying and accommodating section 51. More specifically, the X table 61 of the adhesive material dropping device 60 is extended toward the second substrate supplying and accommodating section 51 from the side of the first substrate supplying and accommodating section 50 and is disposed above the Y table 33 of the bonding apparatus 30. Accordingly, the XY table 63 is constructed by an X table 61 and a Y table 62 on which the preforming nozzle 21 is installed so that it is moved upward and downward.

The remaining wafer ring cassette 5, holding device 6 for holding wafer rings, trays, etc. (merely called "holding device 6") and bonding apparatus 30 in the present invention have substantially the same constructions as the respective constructions shown in FIG. 3; accordingly, a description of these constituting elements is omitted here.

Figure 2:
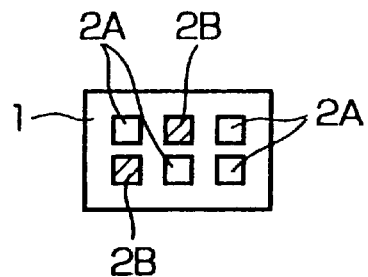
FIG. 2 is a top view of one example of a hybrid semiconductor device.

Next, the operation of the above embodiment will be described. In order to simplify the description, a case in which two types of semiconductor chips 2A and 2B are bonded to each substrate 1 as shown in FIG. 2 will be described. The wafer ring 4A inside the wafer ring cassette 5 is conveyed by a wafer ring conveying means (not shown) and is positioned and held by the holding device 6. Then, the semiconductor chips 2A that are to be picked up are moved to the pick-up position 7.

Meanwhile, a substrate 1 inside the substrate cassette 11 of the first substrate supplying and accommodating section 50 is fed out onto the substrate conveying device 45. When this substrate 1 is conveyed to the adhesive material dropping station of the adhesive material dropping device 60 by the substrate conveying device 45 and is positioned in this station, an adhesive material is dropped onto the bonding portions (located in four places in the case of FIG. 2) on the substrate 1 to which the semiconductor chips 2A are to be bonded, as a result of the movement of the XY table 63 of the adhesive material dropping device 60 in the directions of the X and Y axes and the upward and downward movement of the pre-forming nozzle 21. Then, when the substrate 1 onto which the adhesive material has been dropped is conveyed to the bonding station of the bonding apparatus 30 by the substrate conveying device 45 and is positioned in this bonding station, the bonding tool 31 of the bonding apparatus 30 vacuum-chucks a semiconductor chip 2A from the wafer ring 4A and is moved to a point above the substrate 1, and this semiconductor chip 2A is bonded to a bonding portion on the substrate 1 (to which such a semiconductor chip 2A is to be bonded), in accordance with a method which will be described below.

The vacuum-chucking of the semiconductor chip 2A from the wafer ring 4A by the bonding tool 31 and the transfer and bonding of the chip to the substrate 1 as described above are accomplished in the same manner as in the prior art. In other words, the bonding tool 31 is moved to a point above the pick-up position 7 by the XY table 34 and is lowered, and the push-up needle (not shown) disposed beneath the pick-up position 7 is raised. As a result, a semiconductor chip 2A is pushed upward, and the bonding tool 31 chucks this semiconductor chip 2A by vacuum suction. The bonding tool 31 is raised and is caused to move by the XY table 34 to a point above the bonding portion of the substrate 1 to which the semiconductor chip 2A is to be bonded. Next, the bonding tool 31 is lowered, and the semiconductor chip 2A is bonded to the bonding portion of the substrate 1. Following this bonding, the vacuum of the bonding tool 31 is cut off, and the bonding tool 31 is raised. When the semiconductor chip 2A is picked up from the wafer ring 4A as described above, the next semiconductor chip 2A that is to be picked up is moved to the pick-up position 7.

Since four semiconductor chips 2A are bonded to each substrate 1 shown in FIG. 2, the operation in which the bonding tool 31 vacuum-chucks a semiconductor chip 2A from the wafer ring 4A and bonds this semiconductor chip 2A to a bonding portion of the substrate 1 is performed four times for each substrate 1. When the bonding of all of the semiconductor chips 2A to a single substrate 1 is thus completed, the substrate 1 is conveyed by the substrate conveying device 45 and accommodated in the substrate cassette 14 of the second substrate supplying and accommodating section 51.

The above-described series of processes, i.e., the feeding out of the substrate 1 from the substrate cassette 11, the dropping of the adhesive material on the bonding portions of the substrate 1 to which the semiconductor chips 2A are to be bonded, the bonding of the semiconductor chips 2A to the bonding portions of the substrate 1 to which these semiconductor chips 2A are to be bonded, and the accommodation of the substrate 1 in the substrate cassette 14 of the second substrate supplying and accommodating section 51, are performed for all of the substrates 1 in the substrate cassette 11.

When the bonding of the semiconductor chips 2A to all of the substrates 1 in the substrate cassette 11 has been completed, and all of these substrates 1 have been accommodated in the substrate cassette 14, the bonding of semiconductor chips 2B to the substrates 1 is performed.

The wafer ring 4A held by the holding device 6 is conveyed by the wafer ring conveying device (not shown) and accommodated in its original position in the wafer ring cassette 5. Next, the wafer ring cassette 5 is raised or lowered by the elevator device (not shown) so that the wafer ring 4B is moved to the conveying level, and the wafer ring 4B inside the wafer ring cassette 5 is conveyed by the wafer ring conveying device and positioned and held by the holding device 6.

Furthermore, the pre-forming nozzle 21 is raised as indicated by the one-dot chain line, and the X table 61 is driven so that the Y table 62 is moved to the adhesive material dropping station between the second substrate supplying and accommodating section 51 and Y table 33 as indicated by the two-dot chain line.

Then, a substrate 1 inside the substrate cassette 14 of the second substrate supplying and accommodating section 51 is fed out onto the substrate conveying device 45. When this substrate 1 is conveyed to the adhesive material dropping station of the adhesive material dropping device 60 by the substrate conveying device 45 and is positioned in this adhesive material dropping station, the adhesive material is dropped onto the bonding portions (located in two places in the case of FIG. 2) on the substrate 1 to which the semiconductor chips 2B are to be bonded, as a result of the movement of the XY table 63 of the adhesive material dropping device 60 in the directions of the X and Y axes and the upward and downward movement of the pre-forming nozzle 21. Then, when the substrate 1 onto which the adhesive material has been dropped is conveyed to the bonding station of the bonding apparatus 30 by the substrate conveying device 45 and is positioned in this bonding station, the bonding tool 31 of the bonding apparatus 30 vacuum-chucks a semiconductor chip 2B from the wafer ring 4A and is moved to a point above the substrate 1, and this semiconductor chip 2B is bonded to a bonding portion on the substrate 1 (to which such a semiconductor chip 2B is to be bonded), in accordance with the above-described method.

Since two semiconductor chips 2B are bonded to each substrate 1 shown in FIG. 2, the operation in which the bonding tool 31 vacuum-chucks a semiconductor chip 2B from the wafer ring 4B and bonds this semiconductor chip 2B to a bonding portion of the substrate 1 is performed twice for each substrate 1. When the bonding of all of the semiconductor chips 2B to a single substrate 1 is thus completed, the substrate 1 is conveyed by the substrate conveying device 45 and accommodated in the substrate cassette 11 of the first substrate supplying and accommodating section 50.

The above-described series of processes, i.e., the feeding out of the substrate 1 from the substrate cassette 14, the dropping of the adhesive material on the bonding portions of the substrate 1 to which the semiconductor chips 2B are to be bonded, the bonding of the semiconductor chips 2B to the bonding portions of the substrate 1 to which these semiconductor chips 2B are to be bonded, and the accommodation of the substrate 1 in the substrate cassette 11 of the first substrate supplying and accommodating section 50, are performed for all of the substrates 1 in the substrate cassette 14.

Thus, a plurality of substrates 1 (in this embodiment, all of the substrates 1 inside the substrate cassette 11) are successively fed out from the substrate cassette 11 of the first substrate supplying and accommodating section 50 by the substrate conveying device 45, and semiconductor chips 2A from the holding device 6 are successively bonded to all of the bonding portions of these substrates 1 to which such semiconductor chips 2A are to be bonded. Following the completion of this bonding, the substrates 1 are successively accommodated in the substrate cassette 14 of the second substrate supplying and accommodating section 51. Then, the wafer ring 4A held by the holding device 6 is replaced by the wafer ring 4B which has semiconductor chips 2B that are to be bonded to the substrates 1, and this wafer ring 4B is held by the holding device 6. Next, the substrates 1 accommodated in the substrate cassette 14 are successively fed out by the substrate conveying device 45, and semiconductor chips 2B from the holding device 6 are successively bonded to all of the bonding portions of these substrates 1 to which such semiconductor chips 2B are to be bonded. Following the completion of this bonding, the substrates 1 are successively accommodated in the substrate cassette 11. Accordingly, the number of times that the wafer ring 4 (4A, 4B . . . ) must be replaced is greatly reduced, so that the productivity is improved. Furthermore, the holding device 6 needs to hold only a single wafer ring 4 (4A, 4B . . . ) at a time, there is no increase in the size of the holding device 6.

In the present embodiment, the wafer rings 4 (4A, 4B . . . ) are held by the holding device 6. However, it would also be possible to replace these wafer rings with trays accommodating the respective semiconductor chips 2A, 2B . . . .

Furthermore, in the above, two types of semiconductor chips 2A and 2B are bonded to each individual substrate 1. However, it goes without saying that the present invention can also be applied in cases where three or more types of semiconductor chips 2 (2A, 2B . . . ), etc. are bonded. For example, in a case where three types of semiconductor chips 2A, 2B and 2C are bonded, the substrates 1 accommodated in the substrate cassette 11 of the first substrate supplying and accommodating section 50 (which accommodates the substrates 1 for which the bonding of the two types of semiconductor chips 2A and 2B has been completed by the method described above) are further fed out by the substrate conveying device 45, and the adhesive material is dropped by the adhesive material dropping device 60 (in the state indicated by the solid line) onto the bonding portions of each of these substrates 1 to which semiconductor chips 2C are to be bonded. Meanwhile, the wafer ring 4C is held by the holding device 6. Then, using the above-described method, semiconductor chips 2C are bonded by the bonding apparatus 30 to all of the bonding portions of the substrates 1 to which such semiconductor chips 2C are to be bonded. Following the completion of this bonding, the substrates 1 are conveyed by the substrate conveying device 45 and accommodated in the second substrate supplying and accommodating section 51.

Furthermore, in the above embodiment, all of the substrates 1 in the substrate cassette 11 are successively fed out, only the semiconductor chips 2A are bonded, the substrates 1 are accommodated in the substrate cassette 14, all of the substrates 1 in the substrate cassette 14 are then successively fed out, only the semiconductor chips 2B are bonded, and the substrates 1 are accommodated in the substrate cassette 11. However, different processes can be employed. More specifically, respective pluralities of substrate cassettes 11 and 14 are disposed in the first and second substrate supplying and accommodating sections 50 and 51; all of the substrates 1 in the first, second, third (and so on) substrate cassettes 11 of the first substrate supplying and accommodating section 50 are successively fed out; only the semiconductor chips 2A are bonded to these substrates 1; the substrates 1 are then accommodated in the first, second, third (and so on) substrate cassettes 14 of the second substrate supplying and accommodating section 51; then, all of the substrates 1 inside the first, second, third (and so on) substrate cassettes 14 of the second substrate supplying and accommodating section 51 are successively fed out; only the semiconductor chips 2B are bonded to these substrates 1; and the substrates 1 are then accommodated in the first, second, third (and so on) substrate cassettes 11 of the first substrate supplying and accommodating section 50.

Furthermore, buffer parts that temporarily hold the substrates 1 may be installed instead of the substrate cassettes 11 and 14. More specifically, the first and second substrate supplying and accommodating sections 50 and 51 are not limited to substrate cassettes 11 and 14 or buffer parts; it is sufficient if these parts are stock parts for the substrates 1.

Furthermore, in the present embodiment, a single adhesive material dropping device 60 is provided, and the preforming nozzle 21 is installed so that it is moved between the first substrate supplying and accommodating section 50 and the Y table 33 of the bonding apparatus 30, and between the second substrate supplying and accommodating section 51 and the Y table 33. However, it would also be possible to install adhesive material dropping devices 20 of the type shown in FIG. 3 on both sides of the bonding apparatus 30. Alternatively, it would also be possible to mount the adhesive material dropping device 20 or 60 and the bonding apparatus 30 on the same XY driving means. Furthermore, in the present embodiment, an adhesive material is dropped; however, in the case of bonding that does not require an adhesive material, it goes without saying that there is no need to install an adhesive material dropping device 60.

Furthermore, in the above embodiment, the electronic components are semiconductor chips. However, it goes without saying that these electronic components can be resistors, capacitors, etc.

As described in detail in the above, in the present invention, a substrate conveying device that conveys substrates, first and second substrate supplying and accommodating sections that are respectively disposed at both ends of the substrate conveying device, a bonding apparatus that bonds electronic components to the substrates conveyed by the substrate conveying device, and a holding device which holds a wafer ring or tray that has electronic components, are provided, wherein a first wafer ring or tray which has electronic components of a first type that are to be bonded to the substrates is held by the holding device; a substrate is fed out to the substrate conveying device from the first substrate supplying and accommodating section; the electronic components of the first type on the holding device are successively bonded to all of the bonding portions of the substrate to which electronic components of the first type are to be bonded; the substrate on which the bonding of the electronic components of the first type has been completed is accommodated in the second substrate supplying and accommodating section; the first wafer ring or tray held by the holding device is exchanged by a wafer ring conveying device for a second wafer ring or tray which has electronic components of a second type that are to be bonded to the substrate, thus holding the second wafer ring or tray by the holding device; the substrate accommodated in the second substrate supplying and accommodating section is fed out to the substrate conveying device; the electronic components of the second type on the holding device are successively bonded to all of the bonding portions of the substrate to which electronic components of the second type are to be bonded; and the substrate on which the bonding of the electronic components of the second type has been completed is accommodated in the first substrate supplying and accommodating section. Accordingly, there is no increase in the size of the holding device for wafer rings, etc., and the productivity can be improved.

What is claimed is:

1. A multi-chip bonding method that uses:

a substrate conveying device that conveys substrates, first and second substrate supplying and accommodating sections that are respectively disposed at both ends of said substrate conveying device, a bonding apparatus that bonds electronic components to said substrates conveyed by said substrate conveying device, and a holding device which holds a wafer ring or tray that has electronic components, and said method comprises at least the steps of:

(i) holding a first wafer ring or tray which has electronic components of a first type that are to be bonded to said substrates by said holding device, (ii) successively feeding out substrates to said substrate conveying device from said first substrates supplying and accommodating section, (iii) successively bonding said electronic components of said first type on said holding device to all of bonding portions of said substrates to which electronic components of said first type are to be bonded, (iv) successively accommodating said substrates, on which said bonding of said electronic components of said first type has been completed, in said second substrate supplying and accommodating section, (v) exchanging, by way of using a wafer ring conveying device, said first wafer ring or tray held by said holding device for a second wafer ring or tray which has electronic components of a second type that are to be bonded to said substrates, and holding said second wafer ring or tray by said holding device, (vi) successively feeding out said substrates accommodated in said second substrate supplying and accommodating section to said substrate conveying device, (vii) successively bonding said electronic components of said second type on said holding device to all of said bonding portions on said substrates to which electronic components of said second type are to be bonded, and (viii) successively accommodating said substrates, on which said bonding of said electronic components of said second type has been completed, in said first substrate supplying and accommodating section.

2. The multi-chip bonding method according to claim 1, said method performs:

a dropping of an adhesive material on said bonding portions to which electronic components of said first type are to be bonded on said substrates fed out of said first substrate supplying and accommodating section, and a dropping of an adhesive material on said bonding portions to which electronic components of said second type are to be bonded on said substrates fed out of said second substrate supplying and accommodating section, with a single adhesive material dropping device.

3. The multi-chip bonding method according to claim 1, said method performs:

a dropping of an adhesive material on said bonding portions to which electronic components of said first type are to be bonded on said substrates fed out of said first substrate supplying and accommodating section, and a dropping of an adhesive material on said bonding portions to which electronic components of said second type are to be bonded on said substrates fed out of said second substrate supplying and accommodating section, with respectively separate adhesive material dropping devices.

* * * * *